United States Patent [19]
Norell

[11] Patent Number: 5,454,159
[45] Date of Patent: Oct. 3, 1995

[54] METHOD OF MANUFACTURING I/O TERMINALS ON I/O PADS

[75] Inventor: Ronald A. Norell, Oceanside, Calif.

[73] Assignee: Unisys Corporation, Blue Bell, Pa.

[21] Appl. No.: 198,734

[22] Filed: Feb. 18, 1994

[51] Int. Cl.$^6$ ........................................ H01K 3/30
[52] U.S. Cl. ........................ 29/834; 29/833; 174/266; 228/179.1
[58] Field of Search ................. 29/833, 840, 834; 174/266; 228/179.1

[56] References Cited

U.S. PATENT DOCUMENTS

| | | | |
|---|---|---|---|
| 4,818,728 | 4/1989 | Rai et al. | 228/179.1 X |
| 5,355,283 | 10/1994 | Marrs et al. | 174/266 X |
| 5,359,768 | 11/1994 | Haley | 29/833 X |

FOREIGN PATENT DOCUMENTS

| | | | |
|---|---|---|---|
| 307591 | 3/1989 | European Pat. Off. | 228/179.1 |
| 3-101191 | 4/1991 | Japan | 29/840 |
| 4-177889 | 6/1992 | Japan | 29/840 |

OTHER PUBLICATIONS

IBM Tech. Discl Bull vol. 15 No. 6 Nov. 1972 pp. 1999–2000 by O. R. Abalafia et al.
IBM Tech. Discl Bull vol. 37 No. 02B, Feb. 1994, p. 337.

Primary Examiner—Carl J. Arbes
Attorney, Agent, or Firm—Charles J. Fassbender; Mark T. Starr; Robert R. Axenfeld

[57] ABSTRACT

To manufacture I/O terminals on I/O pads of an electronic component, the electronic component, together with a transparent alignment component which has a reference feature, is placed in a fixture such that the I/O pads are seen through the alignment component and a first one of the two components has a fixed position in the fixture. Thereafter, a second one of the two components is moved in the fixture until a particular position is reached where the I/O pads are aligned with the reference feature; and at that particular position the second one of the two components is confined. Subsequently, the alignment component is replaced at its particular position in the fixture, as attained by the above steps, with an opaque template which has a hole pattern that matches and aligns with the I/O pads. Then, the template hole pattern as positioned by the replacing step, is used to fabricate the I/O terminals on the I/O pads.

14 Claims, 8 Drawing Sheets

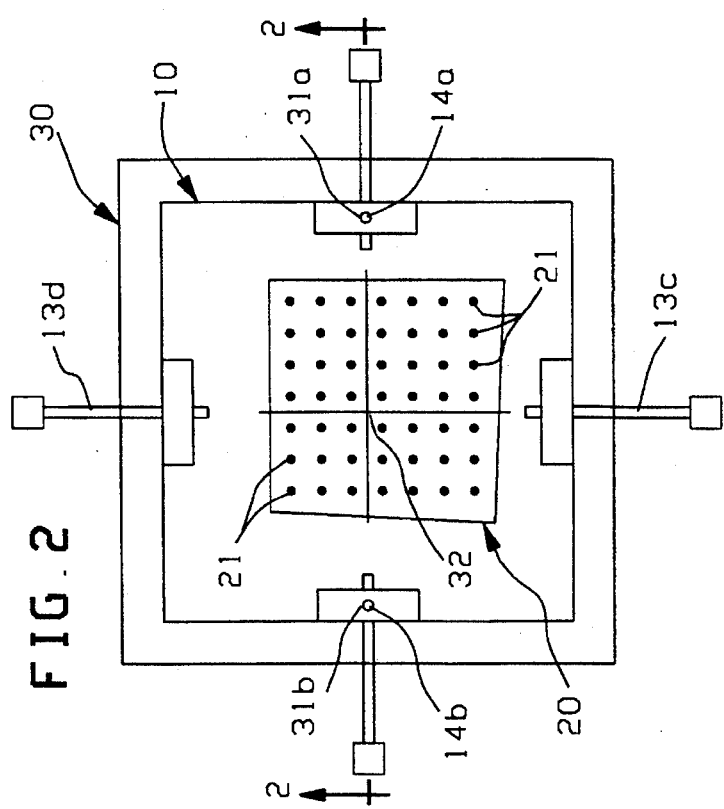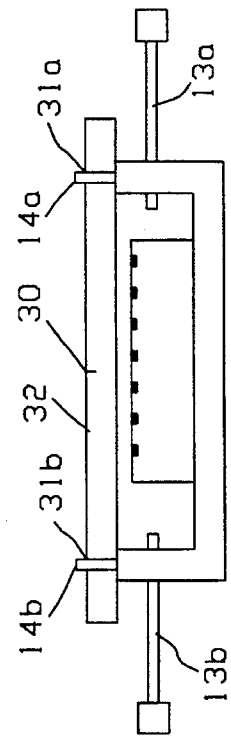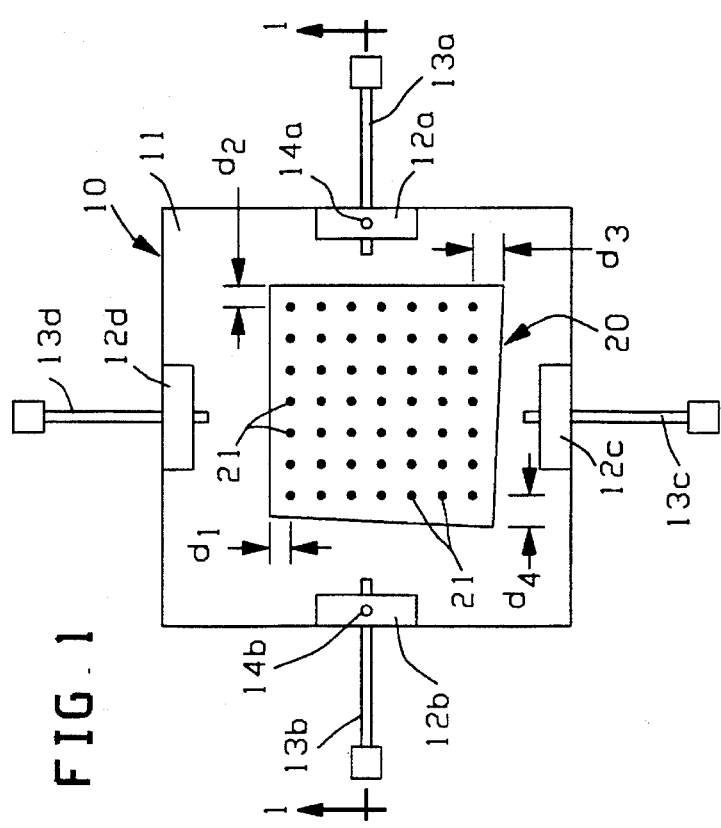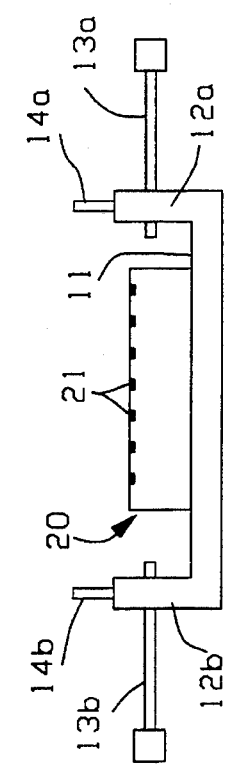

METHOD OF MANUFACTURING I/O TERMINALS ON I/O PADS

BACKGROUND OF THE INVENTION

This invention relates to methods of fabricating input/output terminals (I/O terminals) on input/output pads (I/O pads) of an electronic component.

In the prior art, many types of electronic components exist which include I/O terminals on I/O pads as a means of sending electrical signals to and receiving electrical signals from other circuitry within the component. For example, I/O terminals on I/O pads are commonly provided on a single chip ceramic integrated circuit package. Such a package is made of several layers of ceramic which are integrated together in a stack. Running on and through those layers are microscopic conductors which are patterned to carry electrical signals to and from an integrated circuit chip which gets mounted to the package. Some of those conductors connect to I/O pads which are arranged in a pattern on an outer layer of the stack, and a respective I/O terminal extends outward from the stack on each of the I/O pads.

Similarly, I/O terminals on I/O pads are provided on a multichip ceramic integrated circuit package. Such a package has the same structure as described above, except that it is large enough to house multiple integrated circuit chips and patterned conductors which carry signals to, from, and between the chips. Likewise, I/O terminals on I/O pads are provided on an epoxy glass integrated circuit package which is similar to the above described ceramic packages except that the ceramic layers are replaced with epoxy glass layers.

Now a problem which arises with all of the above described electronic components is that in order to integrate the ceramic layers (or epoxy glass layers) together in a stack, those layers must be subjected to high temperatures and pressures; and that inherently causes the layers to shrink. Further, the amount of shrinkage which occurs varies from one package to another. Consequently, after this shrinkage occurs, the I/O pads which are on an outer layer of the stack are not accurately referenced to any of the sides of the stack.

In the prior art, this inaccuracy between the I/O pads and the sides of the stack had to be eliminated before I/O terminals could be fabricated on the I/O pads; and this was achieved by grinding the sides of the stack until the sides were separated from the I/O pads by a certain predetermined distance. Then, the stack could be placed in a jig which enabled the I/O terminals to be aligned with and attached to the I/O pads by referencing the location of the I/O pads and I/O terminals to the edges of the stack.

However, a problem with the above prior art method of attaching I/O terminals to I/O pads is that it requires the sides of each electronic component to be ground very accurately; and that, compared to the overall cost of the electronic component, is an expensive operation. Accordingly, a primary object of the present invention is to provide a novel method of manufacturing I/O terminals on I/O pads in which the above problem is overcome.

BRIEF SUMMARY OF THE INVENTION

In one preferred process under the present invention, I/O terminals are manufactured on the I/O pads of an electronic component by the following the steps. Initially, the electronic component, together with a transparent alignment component which includes a pair of crosshairs, is placed in a fixture such that the I/O pads are seen through the alignment component and the alignment component has a predetermined fixed position in the fixture. Thereafter, the electronic component is moved in the fixture until one particular position is reached where the I/O pads are aligned with the crosshairs. Then, at that particular position where the alignment occurs, the electronic component is confined. Next, the alignment component is replaced at its fixed position in the fixture with an opaque template which has a hole pattern that matches the I/O pads and is centered at the location which the crosshairs previously occupied. Consequently, the template hole pattern, as positioned by the above replacing step, is aligned with the I/O pads just like the crosshairs were aligned; and that hole pattern is then used to fabricate the I/O terminals on the I/O pads

BRIEF DESCRIPTION OF THE DRAWINGS

FIG. 1 shows an initial step in one preferred process by which I/O terminals are fabricated on the I/O pads of an electronic component under the present invention.

FIG. 1A is a sectional view through various items in FIG. 1.

FIG. 2 shows a second step in the above one preferred process.

FIG. 2A is a sectional view through various items in FIG. 2.

DETAILED DESCRIPTION

Figure 3:
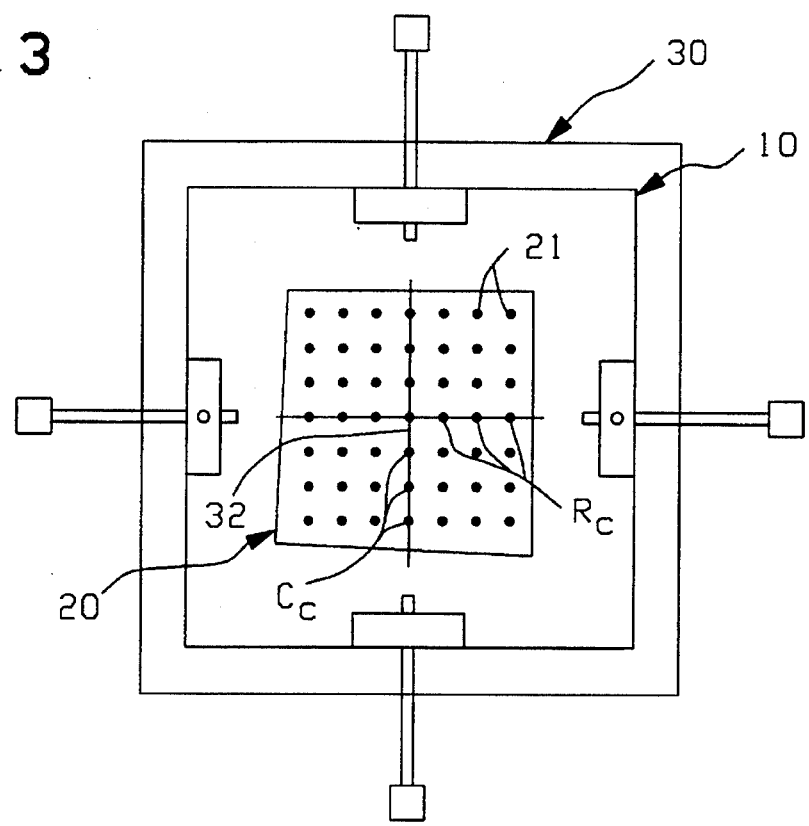
FIG. 3 shows a third step in the above one preferred process.

Referring now to FIG. 1, it shows a top view of a fixture 10 which is used in accordance with the present invention to fabricate I/O terminals on I/O pads 21 of an electronic component 20. A sectional side view of the fixture 10 and electronic component 20, taken along lines 1—1, is shown in FIG. 1A. This fixture 10 has a flat rectangular base 11, and extending upward perpendicular to the base 11 are four sides 12a–12d. Penetrating through each of the sides 12a–12d are respective screws 13a–13d; and, projecting upward from the top of two of the sides 12a and 12b are respective posts 14a and 14b.

In operation, the electronic component 20 is placed on the base 11 at any location within the sides 12a–12d such that its pattern of I/O pads 21 to which respective I/O terminals are to be attached is facing In FIG. 1, as well as all of the other figures, the I/O pads 21 are drawn with a greatly increased size and they are separated by a greatly increased amount of space in order to make them easy to see. In reality, the actual size of the I/O pads and the space between them is microscopic. Suitably, each I/O pad is a round piece of metal of thirty mils in diameter, and all of the I/O pads are arranged in an array on fifty mil centers.

An important aspect of the electronic component 20 is that the I/O pads 21 are not accurately referenced to any of the edges of the electronic component 20. This is shown in FIG. 1 wherein the outermost rows and columns of the I/O pads 21 are separated from respective edges of the electronic component 20 by distances d1–d4 which differ from one electronic component to another due to various manufacturing tolerances. Also as FIG. 1 shows, the manufacturing tolerances can cause one or more of the edges of the electronic component 20 to be non-parallel to the rows and columns of the I/O pads 21. Thus, the electronic component 20 may be any of single chip or multichip integrated circuit packages that are described herein in the "Background".

As the size and spacing of the I/O pads 21 decreases, a point is eventually reached where the variance in the distances d1–d4 approaches the size and spacing of the I/O pads themselves. For example, the thirty mil pads on fifty mil centers may be accompanied by a variance in the distances d1–d4 of plus or minus fifteen mils.

To compensate for the above variances, a transparent alignment component 30 is provided as shown in FIG. 2 and 2A. This transparent alignment component 30 may be made of glass or plastic, and it has a pair of alignment holes 31a and 31b which match the size and spacing of the posts 14a and 14b in the fixture. By placing the transparent alignment component 30 in the fixture 10 such that the posts 14a and 14b protrude through the alignment holes 31a and 31b, the transparent alignment component 30 acquires a predetermined fixed position in the fixture.

Also included in the transparent alignment component 30 is a set of crosshairs 32; and those crosshairs are accurately positioned on the component 30 with respect to the alignment holes 31a and 31b. Consequently, when the transparent alignment component 30 is in the fixture, the crosshairs 32 are accurately positioned with respect to the fixture posts 14a and 14b.

After the transparent alignment component 30 is placed in the fixture, the electronic component 20 is moved on the fixture base 11 until it reaches one particular position where the pattern of I/O pads 21 is aligned with the crosshairs 32. FIG. 3 shows the result of this moving step wherein the crosshairs 32 lie directly over the center row $R_c$ and center column $C_c$ of the I/O pads 21.

Figure 4:
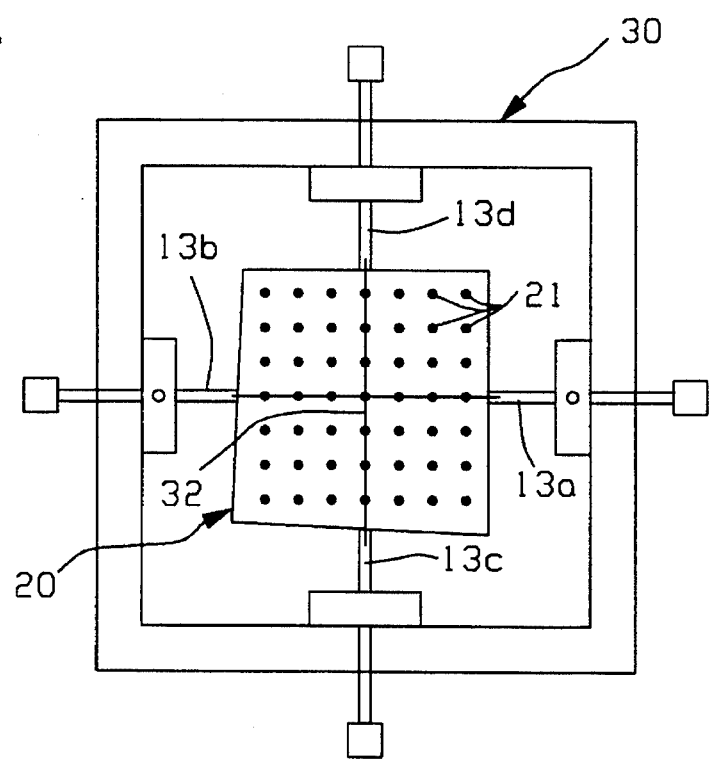
FIG. 4 shows a fourth step in the above one preferred process.

Thereafter, as shown in FIG. 4, the electronic component 20 is confined within the fixture 10 at the above acquired particular position where the I/O pads 21 are aligned with the crosshairs 32. In FIG. 4, this confining step is achieved by turning the screws 13a–13d until they butt up against the sides of the electronic component 20.

Figure 5:
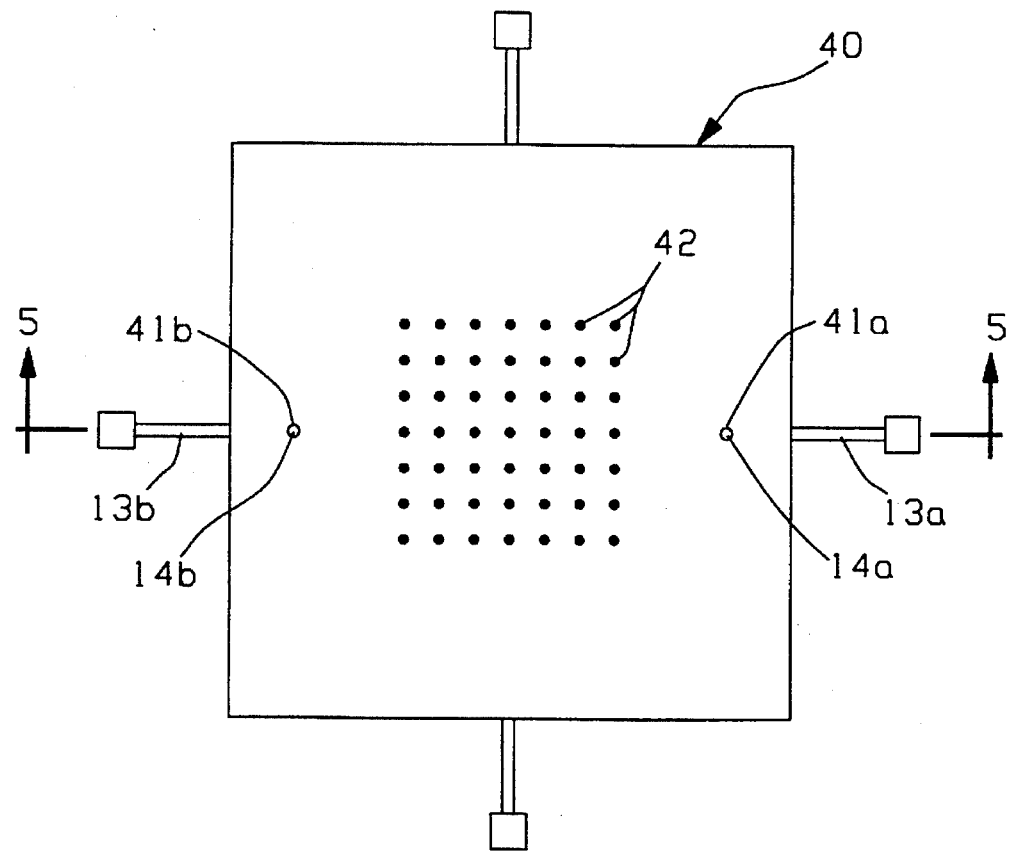
FIG. 5 shows a fifth step in the above one preferred process.
Figure 5A:
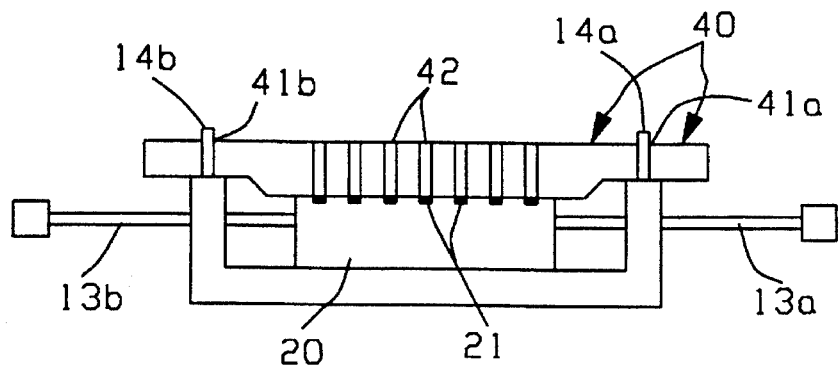
FIG. 5A is a sectional view through various items in FIG. 5.

Following the above steps, the transparent alignment component 30 is removed from the fixture 10 and replaced with a template 40 as illustrated in FIG. 5 and 5A. This template 40 is made of a material which is able to withstand high temperatures such as 400° C.–900° C. and which has a thermal expansion coefficient that closely matches the thermal expansion coefficient of the electronic component. For example, if the bulk of the electronic component is ceramic then the template 40 may be made of graphite.

Why the template 40 must meet the above two constraints is that later in the I/O terminal fabrication process, that template 40 along with the electronic component 20 will be subjected to high temperatures during which time the template 40 and electronic component 20 must expand at about the same rate. This requirement is explained further herein in conjunction with FIG. 7. Here, the point is that in order to meet the above two constraints, the only practical materials of which the template 40 can be made will inherently be opaque.

Formed in the template 40 are a pair of alignment holes 41a and 41b which match the size and spacing of the fixture posts 14a and 14b. Consequently, when the posts 14a and 14b protrude through the alignment holes 41a and 41b, the template 40 is positioned in the fixture 10 at the exact same location which the transparent alignment component 30 previously had.

Further, the template 40 has a pattern of cylindrical shaped holes 42 which matches the pattern of I/O pads 21 on the electronic component 20; and that hole pattern 42 is accurately positioned on the template with respect to the alignment holes 41a and 41b. Thus, the hole pattern 42 will be accurately aligned to the I/O pads 21 whenever the fixture posts 14a and 14b protrude through the template alignment holes 41a and 41b.

After the template 40 has been placed in the fixture as described above, the hole pattern 42 of that fixture is used to fabricate respective I/O terminals on each of the I/O pads 21. One preferred way in which this is achieved is shown in FIG. 6 and 7.

Figure 6:
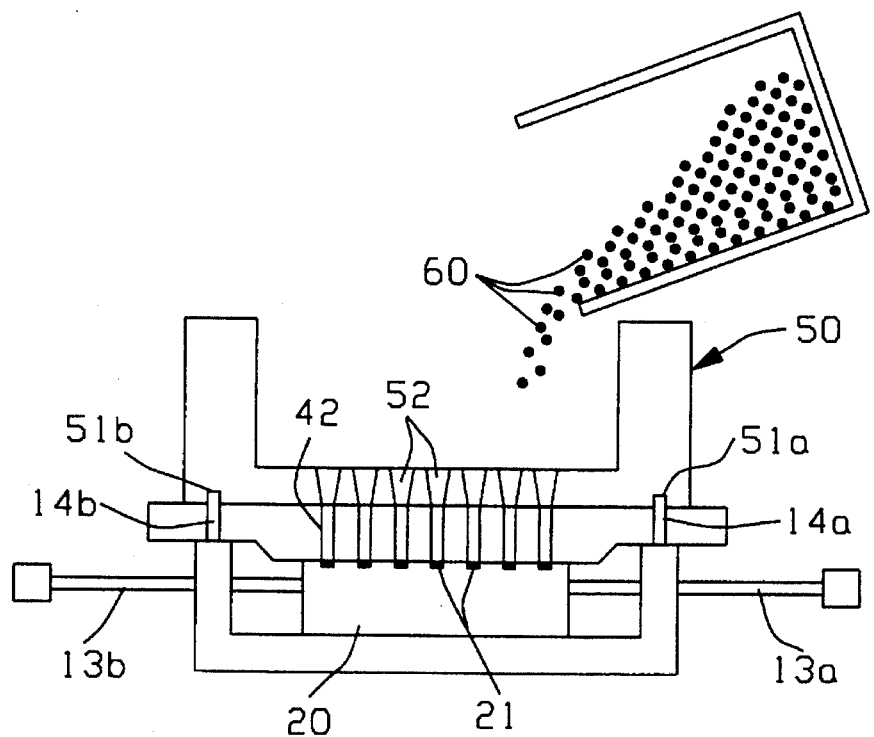
FIG. 6 shows a sixth step in the above one preferred process.

Initially, as FIG. 6 shows, a tub 50 is provided which has a pair of alignment holes 51a and 51b which match the size and spacing of the fixture posts 14a and 14c. Also, the tub 50 has a pattern of tapered holes 52 which matches the hole pattern 42 on the template 40 and which is accurately positioned in the tub 50 with respect to the alignment holes 51a and 51b. Thus, to align the hole patterns 52 and 42, the fixture posts 14a and 14c are inserted into the tub holes 51a and 51b.

Thereafter, the tub 50 is partially filled with solder balls 60. Then, the solder balls 60 are moved around in the tub 50 until they drop into and through the tapered tub holes 52 and into the cylindrical template holes 42. Preferably, this moving of the solder balls is achieved by shaking the fixture 10 together with the electronic component 20 and the template 40 and the tub 50 all in place.

Figure 7:
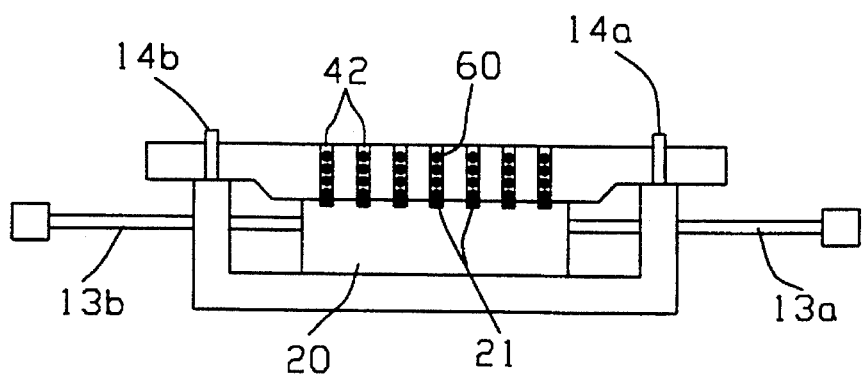
FIG. 7 shows a seventh step in the above one preferred process.

After the template holes 42 are filled, the tub 50 is removed from the fixture; and that leaves the composite assembly of FIG. 7. Then, the FIG. 7 assembly is sent through a belt furnace (not shown). In the furnace, the solder balls 60 are melted to thereby form a cylindrical column of liquid solder in the template holes 42 on top of each of the I/O pads 21. Thereafter, the liquid solder is cooled which causes it to resolidify and thereby form a solid solder column on each of the I/O pads 21.

Since the electronic component 20 and the template 40 have similar thermal expansion coefficients, the I/O pads and solder columns stay in alignment throughout the above melting and resolidifying steps. This staying in alignment is a critical requirement. Otherwise, if the solder columns move relative to the I/O pads, cracks and/or open circuits will occur in the resolidified solder-I/O pad interface.

Following the above operation, the electronic component 20 is removed from the fixture 10. Then, the template 40 is pulled off of the solder columns; and the cylindrical solder columns on the I/O pads of the electronic component are that component's I/O terminals.

One preferred process of fabricating I/O terminals on the I/O pads on an electronic component has now been described in detail. In addition, however, many modifications can be made to the above preferred process without departing from the nature and spirit of the invention; and some specific modifications will now be described in conjunction with the remaining figures.

Figure 8:
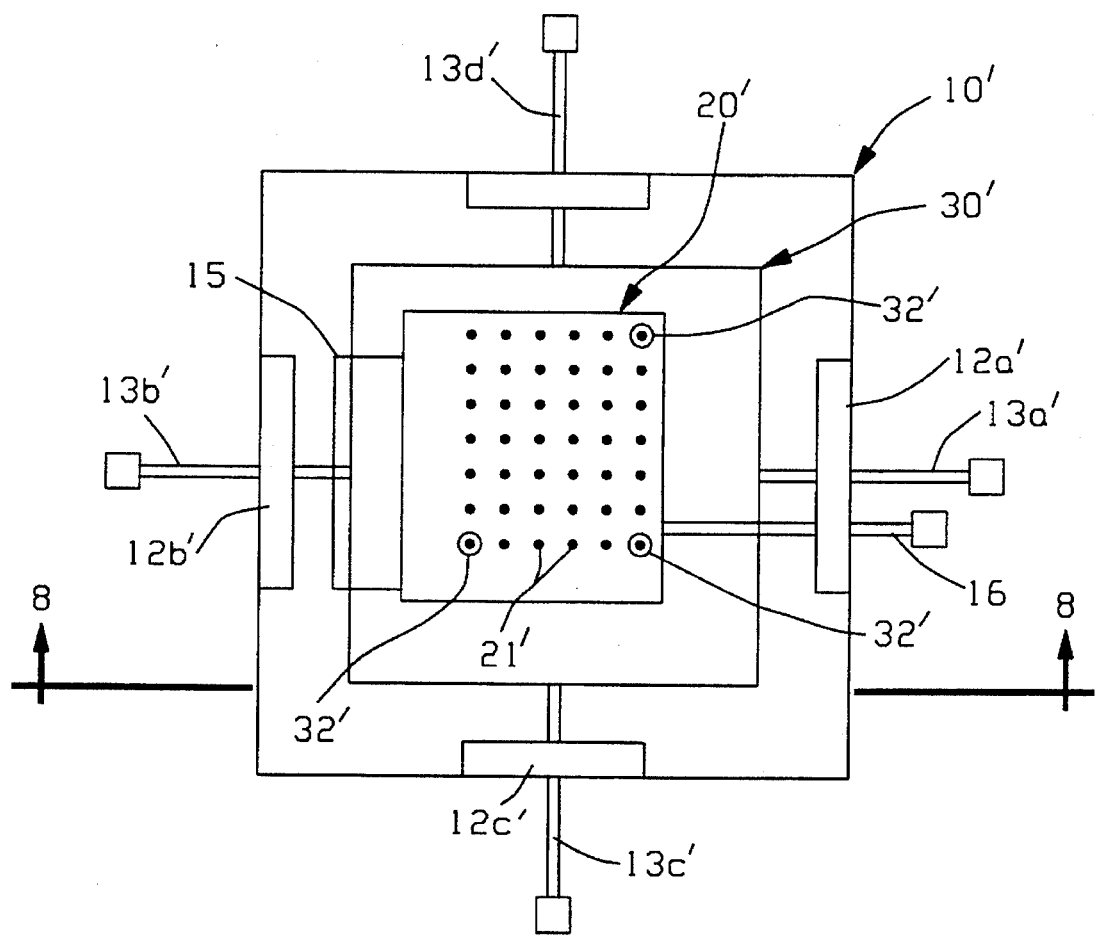
FIG. 8 shows an intermediate step in a second preferred process by which I/O terminals are fabricated on the I/O pads of an electronic component under the present invention.

Considering first FIG. 8, it shows a top view of a modified fixture 10' which is holding a modified transparent alignment component 30' over the I/O pads 21' of a modified electronic component 20'. A sectional side view of the fixture 10' together with the transparent alignment component 30' and the electronic component 20', taken along lines 8—8, is shown in FIG. 8A.

Figure 8A:
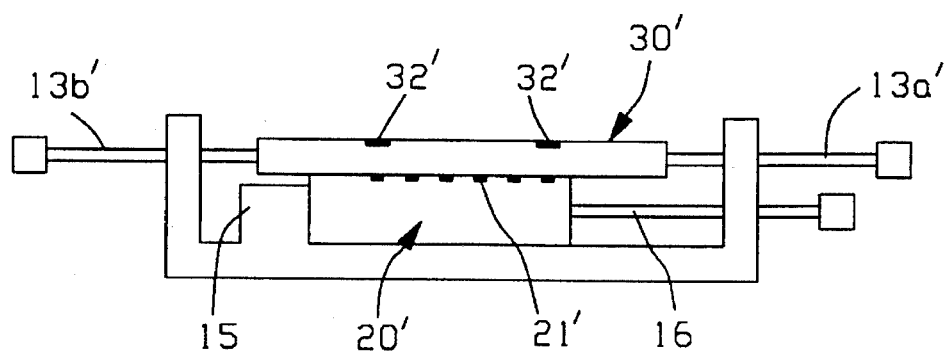
FIG. 8A is a sectional view through various items in FIG. 8.

In FIG. 8 and 8A, all items which are similar to items in FIG. 1–7 have the same reference numeral with a prime appended thereto. For example, item 11' is the base of the fixture 10'; item 12a' is a fixture side that extends perpendicular to the base; and item 13a' is a screw that penetrates through the side 12a'.

One of the modifications which is illustrated in FIGS. 8 and 8A is that the crosshairs 32 have been replaced with a set of three circles 32'. When these three circles 32' lie directly over the I/O pads on three corners of the electronic component 20', the electronic component 30' and the transparent alignment component are aligned. This alignment is shown in FIG. 8.

Also, another variation which is illustrated in the FIG. 8 and 8A is that in order to place the electronic component 20' and the transparent alignment component 30' in alignment with each other, the electronic component is held in the fixture 10' at a fixed position while the transparent alignment component 30' is moved. This is just the opposite of what was previously described in conjunction with the process steps of FIG. 2 and 3.

In order to hold the electronic component 20' at a fixed position, the fixture 10' includes a stop 15 and a screw 16 which hold the electronic component 20 as shown. While the electronic component 20' is held in place, the transparent alignment component 30' is moved on top of the electronic component until the three circles 32' lie directly above three corner I/O pads 21'. When that aligned position is reached, the transparent alignment component 30' is confined by turning the screws 12a'–12d' until they butt against respective sides of that component 30'. This aligned and confined stage of the fabrication process is what FIG. 8 and 8A illustrate.

Figure 8B:
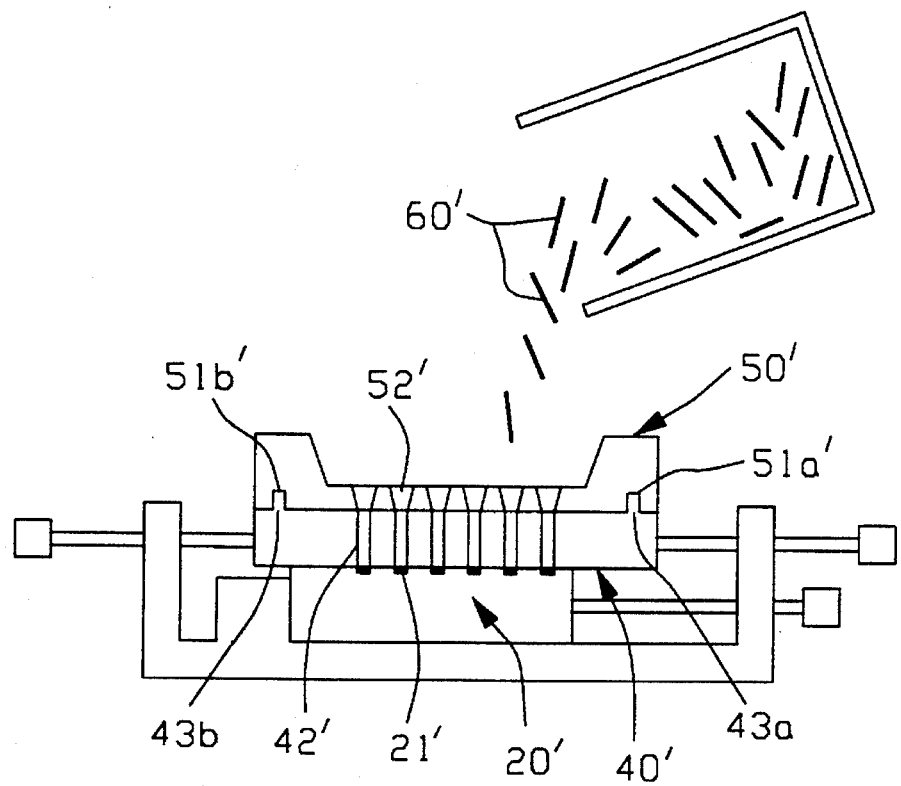
FIG. 8B shows another step in the above second preferred process.

After the transparent alignment component 30' is confined as described above, that component 30' is replaced at its confined position in the fixture 10' with an opaque template 40' as shown in FIG. 8B. Here again, the template 40' is inherently opaque because it must be made of a material which withstands high temperatures and has a thermal expansion rate that matches the expansion rate of the electronic component 20'.

This template 40' is the exact same size as the transparent alignment component 30'; and consequently, the template 40' has the same position in the fixture 10' as the transparent alignment component 30'. Also, the template 40' has a set of cylindrical shaped holes 42' which match the pattern of I/O pads 21' on the electronic component 20'; and those holes 42' are precisely located on the template 40' relative to the template sides. Thus, when the template 40' is positioned in the fixture 10' as described above, the holes 42' will be aligned directly over the I/O pads 21' on the electronic component 20'. Those holes 42' are then used to form respective I/O terminals on each of the I/O pads 21'.

Preferably, to aid in the formation of the I/O terminals on the I/O pads 21', the template 40' has a pair of posts 43a and 43b; and a tub 50' is provided which has a pair of alignment holes 51a' and 51b' which are spaced apart such that the posts fit snugly into the holes. Also, the tub 50' has a pattern of tapered holes 52' which match the pattern of the I/O pads 21' and which are precisely located relative to the alignment holes 51a' and 51b'. Consequently, when the posts 43a and 43b are in the alignment holes 51a' and 51b', the template holes 42' are in alignment with the tub holes 52' as well as the I/O pads 21'.

Thereafter, the tub 50' is partially filled with solder rods 60' as shown in FIG. 8B; and those solder rods are moved around in the tub 50' until a respective rod 60' drops into and substantially fills each of the template holes 42'. After each of the template holes contains one solder rod 60', the above steps which were described in conjunction with FIG. 6 and 7 are repeated. That is, the tub 50' is removed from the template 40'; the resulting structure of the fixture 10' and the electronic component 20' and the solder rod filled template 40' is sent through a belt furnace; the electronic component 20' is removed from the fixture 10; and the template 40' is pulled off of the solder columns which are attached to the I/O pads due to the trip through the belt furnace.

Figure 9:
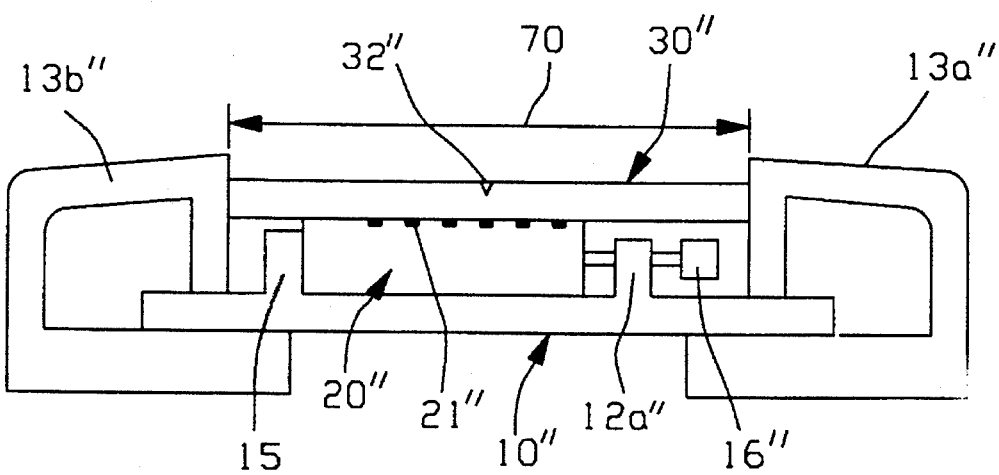
FIG. 9 shows an intermediate step in a third preferred process by which I/O terminals are fabricated on the I/O pads of an electronic component under the present invention.

Considering now FIG. 9, it shows still another modification to the above described processes. In FIG. 9, an electronic component 20" is held in a fixture 10" at a fixed position. This is achieved by providing a stop 15" and a screw 16" which penetrates through a side 12a" in a manner which is similar to that shown in FIG. 8A. Also in FIG. 9, a transparent alignment component 30" rests on top of the electronic component 20"; and that transparent alignment component 30" is moved until a set of crosshairs 32" is in alignment with a pattern of I/O pads 21' on the electronic component 20'. Then, at that aligned position, the transparent alignment component is confined by a pair of springy clamps 13a' and 13b'. These clamps 13a' and 13b' grasp the base of the fixture 10', and they butt up against the transparent alignment component 30" to thereby serve the same confining function as the screws 13a' and 13b' of FIG. 8 and 8A.

After the clamps are in place as shown in FIG. 9, the transparent alignment component 30" is replaced at its aligned position by an opaque template and a tub which are not shown but which are similar to the template 40' and tub 50' of FIG. 8B. In FIG. 9 however, the springy clamps define an opening 70 which precisely positions both the opaque template and the tub; and thus the posts 43a and 43b on the FIG. 8B template and the alignment holes 51a' and 51b' on the FIG. 8B tub can be eliminated.

Figure 10A:
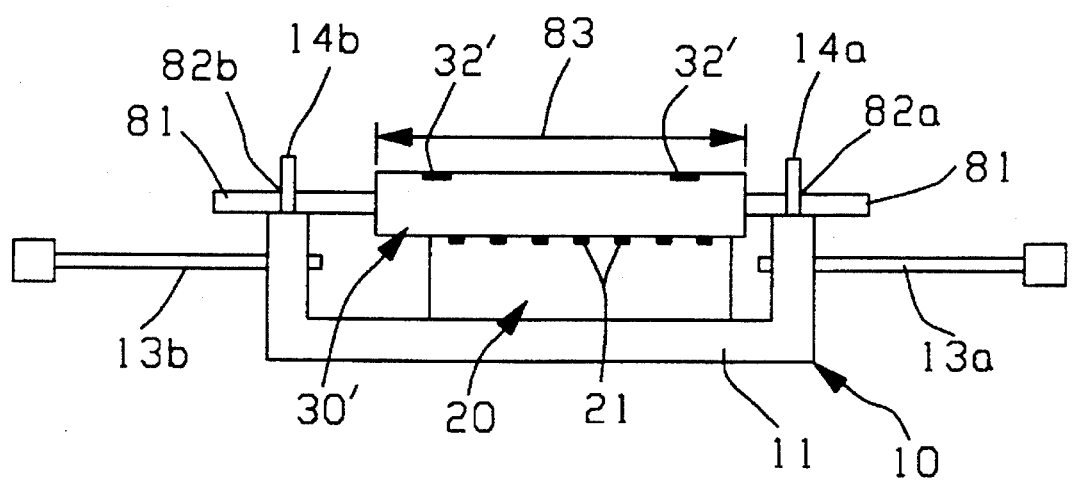
FIG. 10A shows an intermediate step in a fourth preferred process by which I/O terminals are fabricated on the I/O pads of an electronic component under the present invention.
Figure 10B:
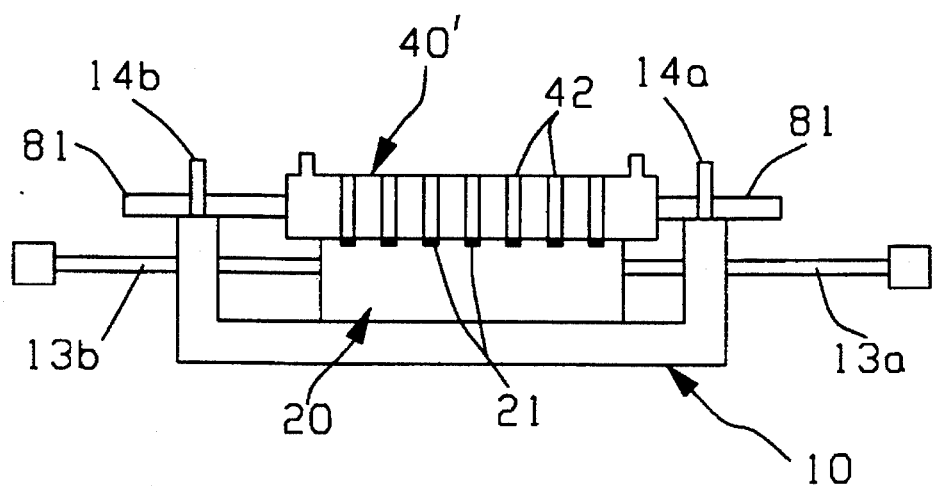
FIG. 10B shows another step in the above fourth preferred process.

Next, with reference to FIG. 10A and 10B, yet another modification to the above described processes will be described. In those figures, the fixture 10 includes all of the parts which are in the fixture 10 of FIG. 1, and like parts are identified by like reference numerals. In addition, the fixture 10 of FIG. 10A and 10B also includes a flat plate 81 which has two alignment holes 82a and 82b into which the two fixture posts 14a and 14b snugly fit.

Also, the fixture plate 81 has a large central opening 83 whose perimeter matches the perimeter of the previously described transparent alignment component 30' of FIG. 8. In operation, the transparent alignment component 30' is inserted into the opening 83 as shown in FIG. 8A. Then, the electronic component 20 is moved in the fixture 10 until three of the corner I/O pads 21 are in alignment with the three alignment circles 32' on component 30'. At that aligned position, the electronic component 20 is confined by turning the fixture screws 13a, 13b, etc. until they butt up against the electronic component.

Thereafter, the transparent alignment component 30' is removed from the fixture plate opening 83 and replaced with the previously described opaque template 40' of FIG. 8B. This step is shown in FIG. 10B. Then, to complete the process of fabricating respective I/O terminals on the I/O pads 21, all of the steps that were previously described in conjunction with FIG. 8B are repeated.

Figure 11:
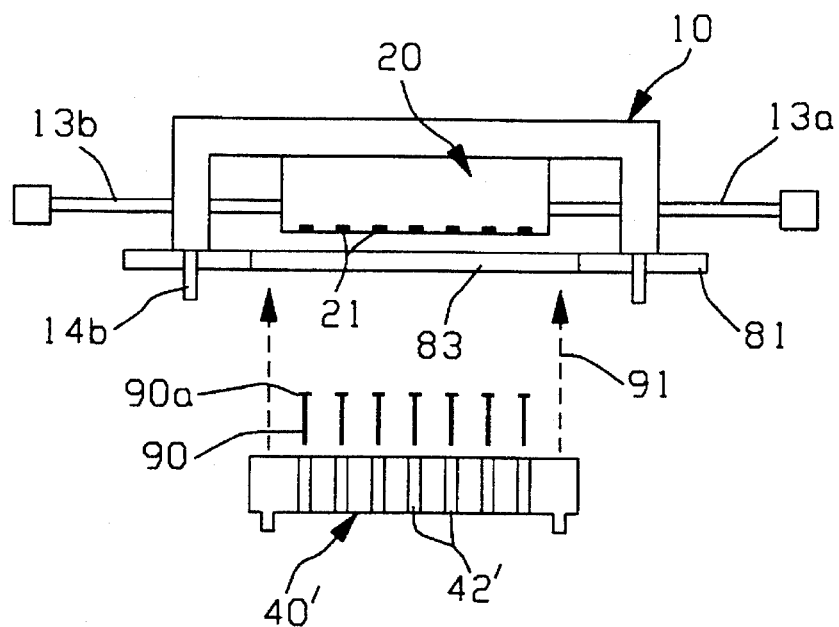
FIG. 11 shows an intermediate step in a fifth preferred process by which I/O terminals are fabricated on the I/O pads of an electronic component under the present invention.

Turning next to FIG. 11, it shows yet another modification wherein, initially, all of the steps that were described above in conjunction with FIG. 10A are repeated. Then, after the electronic component 20 is confined in the fixture 10 at its aligned position by the fixture screws, the transparent alignment component 30' is removed from the fixture plate opening 83 and the resulting structure is turned upside down. This upside down position of the fixture 10 and the electronic component 20 is illustrated in FIG. 11.

Then, a single headed metal pin 90 is inserted into each of the holes 42' of the opaque template 40'. Due to the head 90a on these pins, the pins do not fall through the template holes. Thereafter, the opaque template 40' together with the pins 90 are inserted into the fixture plate opening 83; and this is indicated in FIG. 11 by the arrows 91. Next, the entire composite structure of FIG. 11 is turned right-side-up. In that position, each head 90a of a pin 90 rests on a respective I/O pad 21; and the heads 90a are brazed to the I/O pads by sending the entire right-side-up FIG. 11 structure through a high temperature belt furnace.

Figure 12:
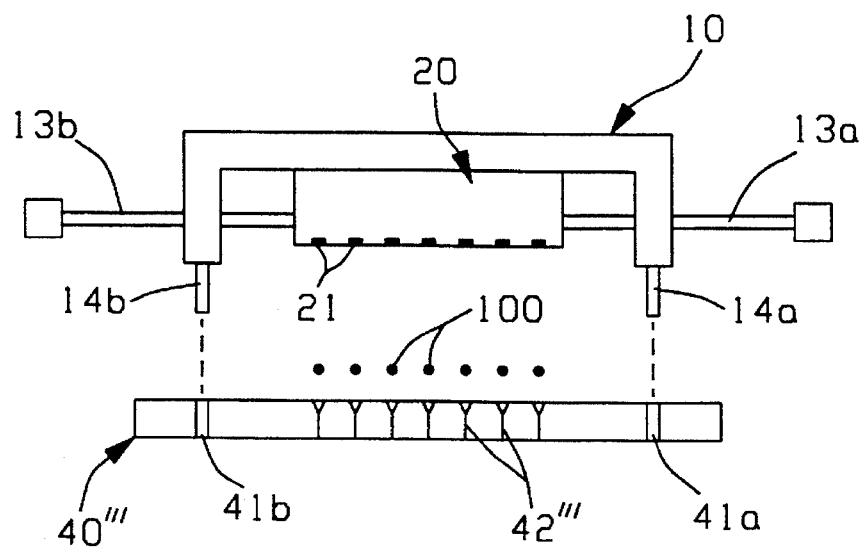
FIG. 12 shows an intermediate step in a sixth preferred process by which I/O terminals are fabricated on the I/O pads of an electronic component under the present invention.

Considering next FIG. 12, it shows a variation on the process of FIG. 11. In FIG. 12, a ten, late 40''' is used which is the same as the template 40 of FIG. 5 and 5A except that the holes 42''' have a cone shaped top. In operation, a single copper ball 100 is disposed in the cone shaped top of each of the holes 42'''. Then, while the fixture 10 and the aligned electronic component 20 are in an upside-down position, the template 40''' is placed onto the fixture posts 14a–14d; and that aligns each copper ball 100 with a respective I/O pad 21. Thereafter, the composite FIG. 12 structure is turned right-side-up and sent through a belt furnace wherein the solder balls 100 become attached to the I/O pads 21. To aid in this attachment, the I/O pads 21 preferably have a film of solder and flux screened on them before the electronic component 20 is inserted into the fixture 10.

As still another modification, the crosshairs 32 and/or the three circles 32' on the transparent alignment components can be replaced with any other visible reference feature. For example, one of the circles 32' of FIG. 8 can be eliminated and the remaining two circles can be replaced with a pair opaque dots. Likewise, the crosshairs 32 of FIG. 3 can be replaced with a rectangular shaped ring which overlies the eight I/O pads that lie next to and surround the one I/O pad at the center of the crosshairs.

Also, as another modification, the step of moving the electronic component and/or the transparent alignment component to an aligned position can be achieved in several ways. For example, those components can be moved by hand, or they can be moved by an automatic camera controlled placement machine. Also, those components can be moved and simultaneously confined, rather than moved and confined sequentially. This may be achieved by pushing them into their aligned position with the fixture screws 13a–13d and 13a'–13d'; or by pushing them into their aligned position with the clamps 13a'' and 13b''.

Further, as another variation, the electronic component and the transparent alignment component need not be confined on all four of their sides. Instead, those components can be confined in a less restrictive manner by eliminating one or two of the screws 13a–13d and 13a'–13d'. In FIG. 4 for example, the screws 13c and 13d could be eliminated provided that a sufficient amount of torque is applied to the remaining screws to keep the electronic component 20 from moving throughout the remainder of the FIG. 1–FIG. 7 fabrication process.

As still another modification, the electronic components 20, 20', and 20'' can have any desired shape, and they can be made of any desired material, and they can have any desired number of I/O pads in any desired pattern. Also, as yet another modification, the solder balls 60 of FIG. 6 and the solder rods 60' of FIG. 8B and the metal pins 90 of FIG. 11 and the copper balls 100 of FIG. 12 can be replaced with any other material of which the I/O terminals are to be made and that material can have any desired shape. For example, the pins 90 can be replaced with gold plated steel rods which have a solder ball attached to one of their ends as a head.

Accordingly, in view of all of the above modifications, it is to be understood that the invention is not limited to the details of any one particular preferred process but is defined by the appended claims.

What is claimed is:

1. A method of manufacturing I/O terminals on I/O pads which are arranged in a pattern on an electronic component; said method including the steps of:

placing said electronic component, together with a transparent alignment component which has a reference feature, in a fixture such that said I/O pads are seen through said alignment component and a first one of said two components has a fixed position in said fixture;

moving a second one of said two components in said fixture until a particular position is reached where said pattern of I/O pads is aligned with said reference feature;

confining said second one of said two components in said fixture at said one particular position;

replacing said alignment component, at its position in said fixture as attained by the above steps, with an opaque template which has a hole pattern that matches and aligns with said pattern of I/O pads; and, using said hole pattern in said template, as positioned by said replacing step, to fabricate said I/O terminals on said I/O pads.

2. A method according to claim 1 wherein said first one of said two components is said alignment component, and said second one of said two components is said electronic component.

3. A method according to claim 1 wherein said first one of said two components is said electronic component, and said second one of said two components is said alignment component.

4. A method according to claim 1 wherein said reference feature on said alignment component is a set of crosshairs.

5. A method according to claim 1 wherein said reference feature on said alignment component is a set of visible marks.

6. A method according to claim 1 wherein said moving step is achieved by turning screws in said fixture which push against said second one of said two components.

7. A method according to claim 1 wherein said moving step is achieved by sliding said second one of said two components by hand in said fixture.

8. A method according to claim 1 wherein said confining step is achieved by turning screws in said fixture such that they lie against said second one of said two components.

9. A method according to claim 1 wherein said confining step is achieved by placing clamps in said fixture such that they lie against said second one of said two components.

10. A method according to claim 1 wherein said moving step and said confining step are performed simultaneously.

11. A method according to claim 1 wherein said using step includes the substeps of disposing multiple solder balls into each hole of said hole pattern, and thereafter melting and resolidifying all of the solder balls in their respective holes to the aligned I/O pads.

12. A method according to claim 1 wherein said using step includes disposing the substeps of a single solder rod into each hole of said hole pattern, and thereafter melting and resolidifying all of the solder rods in their respective holes to the aligned I/O pads.

13. A method according to claim 1 and further including the step of disposing a single metal pin into each hole of said template prior to said replacing step, and wherein said using step includes the substep of brazing all of the metal pins in their respective holes to the aligned I/O pads.

14. A method according to claim 1 and further including the step of disposing a single solder ball into each hole of said template prior to said replacing step, and wherein said using step includes the substep of melting and resolidifying all of the solder balls in their respective holes to the aligned I/O pads.

* * * * *